NEGATIVE RESISTANCE SEMICONDUCTOR DEVICE STRUCTURE

Filed May 1, 1959 2 Sheets-Sheet 1

INVENTOR
Solomon L. Miller

BY
Sughrue, Rothwell, Mion & Zinn
ATTORNEYS

June 13, 1961 S. L. MILLER 2,988,677

NEGATIVE RESISTANCE SEMICONDUCTOR DEVICE STRUCTURE

Filed May 1, 1959 2 Sheets-Sheet 2

INVENTOR

Solomon L. Miller

BY Sughrue, Rothwell, Mion & Zinn

ATTORNEYS 2,988,677

NEGATIVE RESISTANCE SEMICONDUCTOR DEVICE STRUCTURE

Solomon L. Miller, Poughkeepsie, N.Y., assignor to International Business Machines Corporation, New York, N.Y., a corporation of New York Filed May 1, 1959, Ser. No. 810,390
5 Claims. (Cl. 317—234)

This invention relates to a negative resistance semiconductor device and more particularly to a device which exhibits a so-called hook collector characteristic. The present invention is a modification of a semiconductor device disclosed in the co-pending U.S. application Serial No. 780,300 by Richard F. Rutz, filed on December 15, 1958, and assigned to the assignee of the instant application.

In the conventional hook collector semiconductors in the prior art of the type described in "PNPN Transistor Switches" by J. L. Moll et al., Proc. IRE, vol. 44, September 1956, the voltage at which the critical junction of the semiconductor breaks down to provide a rapidly increasing current through a transistor is well defined. However, not so well defined is the current through the transistor at which the negative resistance characteristic is evidenced. Consequently, in the conventional type of hook collector diode in the prior art there is little control over the point at which the voltage switches from the critical breakdown voltage across the diode to a minimum voltage thereacross. Also, the current in this switching region is an irregular function of the voltage. Further, capacitive currents and variations in alpha of different portions of the prior art devices contribute to a response behavior which is different for different switching rates.

It is therefore an object of this invention to provide a negative resistance semiconductor device in which (1) the breakdown voltage of the critical junction is well defined whereupon the current through the device rapidly increases, and, (2) the value of current flowing through the transistor necessary to cause the switch to low voltage drop is also well defined. Additionally, the semiconductor device of this invention provides that the current flowing therethrough during the hooking action more nearly approaches a linear function of the voltage than has previously been available.

It is a further object of this invention to provide a multiple junction semiconductor device functioning as a diode in which the switch to low voltage drop is achieved by the avalanche breakdown of at least two of said junctions so that the critical voltage at which the first junction breaks down defines the initiation of high current, the flow of high current in turn flowing through the selected internal resistance in one zone produces a voltage drop which causes a second breakdown and initiates hook action which thus manifests the negative resistance characteristic of the device.

According to the present invention, there is provided a multiple junction semiconductor device in which a junction having a low reverse breakdown potential is formed between two adjacent regions of opposite conductivity type semiconductor material which are heavily doped with their respective impurity elements, with one of said two adjacent regions being an electrode making further contact with a lightly doped base region of like conductivity type material which is also adjacent to the other of said two adjacent regions.

The term "avalanche" in this discussion is employed to include both avalanche or Zener mechanisms currently used in the art and any voltage sensitive similar breakdown mechanism.

In the accompanying drawings, FIGURES 1 to 4, inclusive, are taken from the previously identified co-pending application.

Figure 1:
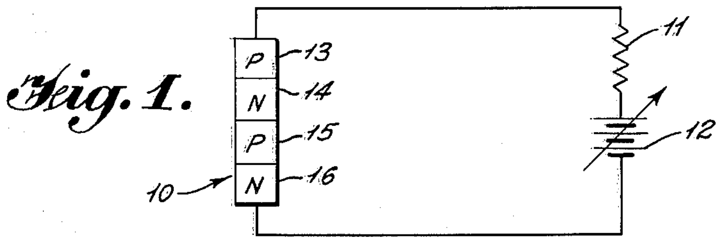
FIGURE 1 is a diagrammatic representation of a circuit including a conventional PNPN diode.
Figure 2:
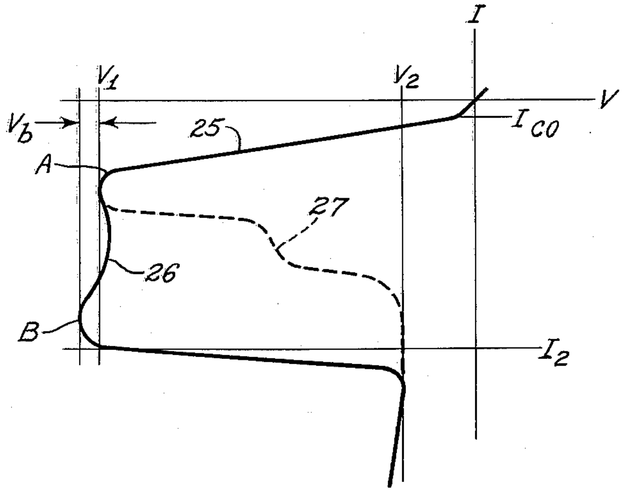
FIGURE 2 is a graphical illustration of voltage versus current under the conditions of operation of a negative resistance structure illustrating both the present invention and the prior art.
Figure 3:
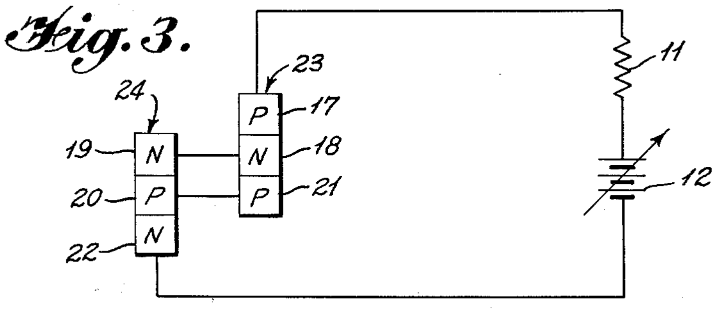
FIGURE 3 is an analytic illustration conventionally used to explain the functioning of a device such as FIGURE 1.

Referring first to FIGURES 1 to 3 , inclusive, the diode 10 is a PNPN diode constructed in accordance with the prior art. It is connected in series with a resistor 11 to the plus side of a variable voltage source 12. The negative side of the source 12 is connected to the outermost N-region of the diode 10 and both are jointly connected to ground. Referring to FIGURE 3, there is shown a diagrammatic illustration of the functioning of the diode of FIGURE 1. Actually, the diode of FIGURE 1 acts in the circuit in a manner similar to the PNP and NPN transistors arranged in the manner shown in FIGURE 3. The P-region 13 of diode 10 is the same as the P-region 17 of transistor 23; the N-region 14 is the same as the N-regions 18 and 19 of transistors 23 and 24; the P-region 15 is the same as the P-regions 20 and 21 of the transistors 23 and 24; and the N-region 16 is the same as the N-region 22 of transistor 24. The load resistor 11 is common in both of these diagrams, as is the variable voltage source 12. Upon the application of a relatively small voltage to the transistors 23 and 24, the PN diode of the transistor 23 is forward biased. However, the NP diode 18 and 21 of transistor 23 and the NP diode 19 and 20 of transistor 24 are reversed biased. Consequently, the only current flowing therethrough is essentially the $I_{co}$ of these diodes which is the reverse leakage current therethrough of an extremely small value. As the voltage applied across the transistors increases this saturation current increases somewhat until finally both junctions defined between the NP diodes of transistors 23 and 24 breakdown. At this time an increased amount of current is permitted to flow therethrough and the transistors in effect offer a greatly decreased impedance to current flow. When this happens the transistors combine to provide a negative resistance characteristic by virtue of the fact that the large current flow is accompanied by a decrease of voltage drop thereacross. The point at which the breakdown occurs is a function of the voltage applied across the transistor which reaches a critical value when the two NP diodes in the transistors 23 and 24 break down. The current rapidly increases to a stable value accompanied by a reduction in voltage across these two transistors. The current value at which this negative resistance characteristic is initiated is not well defined and also current in this critical region is an irregular function of the voltages.

The operation of these two transistors 23 and 24 exemplifying the operation of a typical negative resistance device such as the diode 10 of FIGURE 1 is shown graphically by dotted line in FIGURE 2. As can be seen, as the voltage increases across the transistor there is initially a very small increase in the current flow therethrough as represented by the portion of the curve labeled 25. However, when $V_1$ is reached, the current has reached a value which will cause breakdown of the critical junction in the diode 10. At a certain current, defined by the fact that the sum of the low voltage alpha of the individual portions of the device exceeds unity, the hook action is initiated. By the term "hook action" is meant that the total amplification factor of the device becomes greater than or equal to unity. The voltage across the diode 10 collapses with an increase of current therethrough denoted by the portion of the curve labeled 27, thus manifesting the negative resistance characteristic.

The negative resistance device constructed in accordance with the present invention, however, will function as illustrated by the solid line curve including indicative portions labeled 25 and 26 which described the effect. The initial portion of the solid curve is substantially identical to the initial portion of the dotted curve. Here it can be seen that the current values at which the hook action B, as well as the avalanche action A, are initiated are well defined. The current at the hook action B is identified as $I_2$. Also the current flow through the negative resistance device constructed in accordance with this invention during the collapse of voltage from $V_1$ and $V_2$ across the device is a more linear function of this voltage than is indicated by the portion 27 of the dotted curve.

Figure 4:
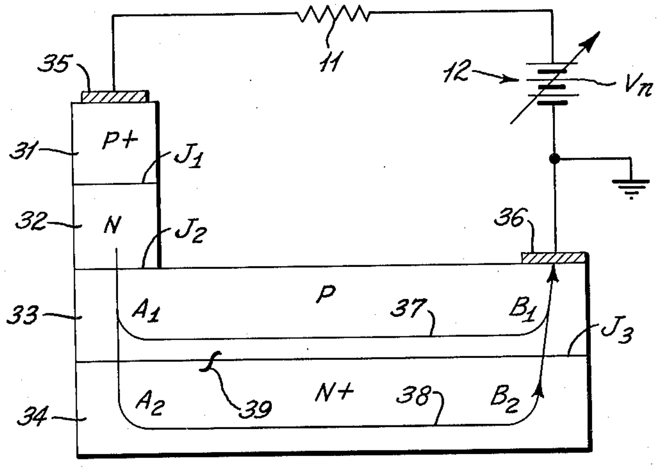
FIGURE 4 is a diagrammatic illustration of a negative resistance device constructed in accordance with the invention of the aforementioned U.S. application Serial No. 780,300, and employed in a circuit which will exemplify its functioning.

For the purpose of merely describing the basic principle of two-junction breakdown which is employed in the present invention, FIGURE 4 is now referred to which shows an embodiment of the invention disclosed in the aforementioned U.S. application Serial No. 780,300. The negative resistance device is four-region PNPN semiconductor structure and in this illustration the two terminal ohmic connections 35 and 36 are now made to P-regions 21 and 33, respectively, while the N-regions 32 and 34 are left floating. As may be apparent to one skilled in the art connections to the floating regions may be made for signal introduction purposes. P-regions 31 and N-regions 34 are more heavily doped with their respective impurities than are the two innermost N and P-regions 32 and 33, respectively. A region heavily doped provides less resistance to current passing therethrough than does a region lightly doped.

If a positive potential is applied to the top P-region 31 as shown in FIGURE 4, then the three PN junctions labeled $J_1$, $J_2$ and $J_3$ will be biased as indicated. Junction $J_1$ is biased in a forward direction since a more positive voltage is applied to the P-region 31 than is applied to N-region 32. Conversely, junction $J_2$ is reversed biased, since N-region 32 is at a more positive potential than is P-region 33. Junction $J_3$, however, will be both forward and reversed biased in different places as shown. This is due to the fact that the potential drop from point $A_1$ to point $B_1$ in P-region 33 due to the current flowing in path 37 will be greater than the potential drop between points $A_2$ and $B_2$ in the N-region 4 due to the current flowing in path 38. This is because the P-region 33 is more lightly doped than is the N-region 4, and thus provides more resistance to the flow of current. This difference in resistance can be further insured by making the N+ region 34 thin and covering it with a good conductor such as a solder coating not shown. This potential drop, then, between points $A_1$ and $B_1$ in the P-region 33 is of such a magnitude so as to cause the right-hand section of P-region 33 to be at a lower potential than is the right-hand section of N-region 34, thus creating a reverse bias at this section of the $J_3$-junction. Since the N+ region is of very low resistance, it may be considered to be equipotential throughout and point 39 is a point along the junction $J_3$ and the region 33 where the potential is equal to the potential of region 34. The device is further doped such that the reverse breakdown voltage for junction $J_2$ will be much greater than the reverse breakdown voltage for the right-hand section of junction $J_3$.

For applied voltages $V_n$ across the semiconductor device which are less than the breakdown voltage for the junction $J_2$, only small reverse currents will flow across this junction and through parallel paths 37 and 38 to the base ohmic connection 36. The current through the essentially equipotential N-region will be quite limited by the low reverse leakage current coming through the reversed bias section of junction $J_3$. Point A on the curve 25 shown in FIGURE 2 will be reached when the applied voltage $V_n$ equals the breakdown voltage for junction $J_2$, which corresponds to $V_1$ on the curve. Thus junction $J_2$, whose resistance has been decreased due to the avalanche breakdown phenomenon occurring at voltage $V_1$, will permit a higher current to flow into the bottom two P-N regions. This current is represented by the line 26 in FIGURE 2. The greater portion of this higher current will flow in path 37 of P-region 33 and will increase the potential drop between P-region 33 and N-region 34 at the right-hand section of junction $J_3$. When the drop across this right-hand section of junction $J_3$ reaches the breakdown voltage at $J_3$, then a large current begins to flow in path 38 through the N-region 34. The breakdown of junction $J_3$ is considered to occur at point B shown in the curve in FIGURE 2. Thus, at point B of FIGURE 2 there are now two large currents flowing in paths 37 and 38 of FIGURE 4. The sum of these two currents must equal the current flowing across junction $J_2$. It is therefore seen that the effective resistance of the parallel paths 37 and 38 is reduced when the voltage breakdown at the right-hand section of $J_3$ is reached.

The variation in curvature at point A in the curve is due to the fact that the avalanche process can be sustained at a slightly lower voltage due to an increase in injection of holes from the P+ region 31 or an increase in lifetime in region 32 as current increases. This process, in general, is the beginning of a negative resistance such as curve 27 of the prior art, however, in the device shown in FIGURE 4 the built-in positive resistance in region 33 over-rides the negative resistance and provides a positive slope 26 to the portion of the curve between points A and B. In cases where the injection at junction $V_1$ is constant the voltage indicated as $V_b$ will equal $V_2$ and the slope of the portion 26 of the curve will be a measure of the effective resistance of zone 33.

The large current coming out of the forward biased region of junction $J_3$ will be minority carriers so that it acts as the emitter to the hook collector formed by P-region 31 and N-region 32. This large current, which is indicated at point B of FIGURE 2, now causes the voltage across the entire unit to collapse to voltage $V_2$ due to typical hook collector transistor action. A negative resistance characteristic is thus exhibited by the device. Since the only function of the P-region 31 and N-region 32 is to provide a PN hook collector, it is seen that this top junction $J_1$ may be replaced by any electrode with an inherent amplifying and multiplying action.

In summing up the above operation, it is seen that at point A of the curve shown in FIGURE 2 the breakdown voltage $V_1$ of junction $J_2$ is reached, thus causing more current to flow in path 37 of P-region 33 than was formerly flowing before voltage $V_1$ was reached. This increased current in path 37 causes the reverse bias on the right-hand section of junction $J_3$ to become greater, until the breakdown voltage of junction $J_3$ is attained, at which time point B has been reached on the curve of FIGURE 2. Upon the breaking down of the junction $J_3$ a large current can now begin to flow in path 38 as well as in path 37, thus creating a much larger current flow through the entire device and especially through junction $J_2$ and $J_1$. The typical hook action of the top PN hook collector now occurs wherein, since region 34 is established by the broken down portion of $J_3$ at essentially reference potential, any increase in flow through path 37 serves to increase the forward bias on the forward biased portion of $J_3$ and therefore increases the injection of minority carriers each of which liberates alpha majority carriers where alpha is the amplification of the hook. The entire voltage across the device thus reverts to voltage $V_2$ as is shown in FIGURE 2.

It is seen, therefore, that the voltage breakdown of both junctions $J_2$ and $J_3$ is required before the PNPN diode of FIGURE 4 exhibits a negative resistance characteristic due to the action of its PN hook collector. The critical breakdown voltage across junction $J_2$ is essentially applied by voltage $V_n$, which is of fairly large magnitude. However, the voltage drop across the right-hand section of junction $J_3$ is created only by the current flowing in parallel paths 37 and 38. The magnitude of this voltage drop is therefore somewhat limited, and so the breakdown voltage across junction $J_3$ at this point must be low as compared to that for junction $J_2$.

Figure 5:
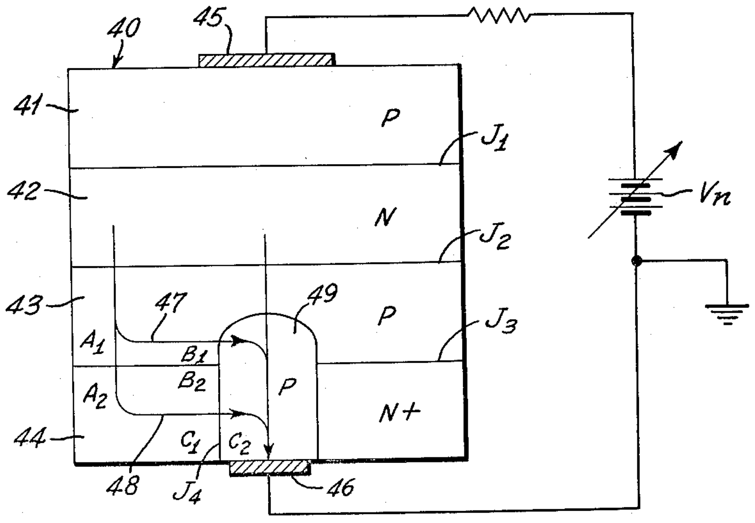
FIGURE 5 is a diagrammatic representation of a negative resistance device constructed in accordance with the present invention and employed in a circuit which will exemplify its functioning.

In accordance with the present invention, a rectifying junction having a low reverse breakdown potential is fabricated in another way by modifying the construction and geometry of the semiconductor diode device shown in FIGURE 4. FIGURE 5 shows an embodiment of the present invention disclosed by the instant application. The semiconductor device 40 there shown is composed of four alternate PNPN regions 41, 42, 43, and 44, respectively, in which the N-region 44 is heavily doped with its majority carrier, while N-region 42 and P-region 43 are lightly doped with their respective majority carriers. P-region 41 may also be heavily doped with its majority carrier, although it is not essential to the operation of the device that this be so. The P-region 41 together with N-region 42 form the PN hook collector for the diode 40, while N-region 44 is a floating emitter for said diode. Contact is made to the base P-region 43 by an evaporated and later alloyed electrode 49 through the floating emitter region 44. Electrode 49 consists of heavily doped P-type material. Ohmic contacts 45 and 46 are now made to the terminal P-region 41 and to the electrode 49, across which is applied a variable voltage $V_n$.

With voltage applied as shown in FIGURE 5, junction $J_2$ of diode 40 is reverse biased and corresponds to junction $J_2$ in FIGURE 4. All current flowing across the entire length of junction $J_2$ into the bottom two conductivity regions must eventually reach ohmic contact 46 after having traveled through electrode 49. That current which crosses the $J_2$ junction at points away from the center axis of the crystal will divide into the two parallel current paths 47 and 48 through P-region 43 and N-region 44, respecttively, before it eventually reaches electrode 49. Although there has only been shown current flow in the left-hand portion of the cross sectional view of FIGURE 5, it is understood that a similar current flow exists in the right-hand portion.

Junction $J_3$ is forward biased at points away from the electrode 49 due to the fact that the P-region 43 is at a higher potential than the N-region 44. These points are indicated by $A_1$ and $A_2$. However, as in FIGURE 4, P-region 43 offers a greater impedance to current flow therein than does N-region 44, due to the difference in degrees of doping. Current in path 47 through P-region 43 therefore causes a much greater voltage drop therein than does the current flowing in path 48 through N-region 44. This causes the portions of junction $J_3$, which are near the electrode 49, to be reverse biased as was previously described in connection with FIGURE 4. Furthermore, the current which flows from P-region 43 into electrode 49 and thereafter out through ohmic contact 46 does not cause any substantial voltage drop in said electrode 49, due to the fact that this electrode comprises heavily doped P-type material which offers little impedance to current flow therein. Therefore, points $B_1$ in P-region 43 and $C_1$ in electrode 49 can be considered to be at about the same potential. The junction $J_4$, which has been formed between the electrode 49 and N-region 44, is therefore also reverse biased in the same fashion as is the reverse biased portion of junction $J_3$. However, the portion of junction $J_4$ at points $C_1$ and $C_2$ near the surface of device 40 has a much lower reverse breakdown voltage than does the reverse biased portion of junction $J_3$. This is a result of the abrupt alloy junction between the heavily doped electrode 49 and the heavily doped surface of the emitter region 44. Furthermore, the breakdown voltage of this particular portion of junction $J_4$ can be raised by etching the surface of N-region 44 near the electrode 49.

The operation of the device shown in FIGURE 5 will now be explained in connection with FIGURE 2. For values of voltage $V_n$ up to voltage $V_1$ shown in FIGURE 2, only a small current is able to flow through device 40 due to the presence of the highly resistive reverse biased junction $J_2$. In the two bottom conductivity regions, the majority of this current will flow in path 47 to electrode 49 since there are other reverse biased junctions $J_4$ and $J_3$ between the N-region 44 and electrode 49, and N-region 44 and P-region 43, respectively. At voltage $V_1$ in FIGURE 2, the junction $J_2$ breaks down and allows more current to flow through the device. The majority of this current increase will also flow in path 47, thus increasing the potential drop between points $A_1$ and $B_1$ in P-region 43. Because the potential drop between points $A_2$ and $B_2$ in N-region 44 is negligible, the potential drop across junction $J_3$ at points $B_1$ and $B_2$ near electrode 49 is increased. Since points $C_1$ and $C_2$ are considered to be at the same potential as are points $B_1$ and $B_2$, respectively, the potential drop across junction $J_4$ near the surface is also increased. When point B in the curve of FIGURE 2 is reached, the current flowing through the device is large enough to make the potential drop across points $C_1$ and $C_2$ equal to the reverse breakdown voltage of junction $J_4$ at this point, which is lower than that of junction $J_3$. A large current now begins to flow across junction $J_4$ through path 48 in N-region 44 which thus acts as an emitter for the PN hook collector formed by P-region 41 and N-region 42. The negative resistance characteristic of the device is now manifested, and the voltage across terminals 45 and 46 reverts to voltage $V_2$ in FIGURE 2.

It should therefore be appreciated that with the above-described semiconductor device of FIGURE 5, it is a relatively simple matter to obtain the second reverse biased junction having a low breakdown potential. Furthermore, it is easy to attach a base ohmic contact 46 to the electrode 49.

Various geometrical and electrical modifications of the structure may obviously be made without departing from the scope of the invention as expressed in the appended claims. However, there must always be sufficient current paths through a lightly doped base region which are parallel to a rectifying junction between the emitter region and said base region so as to create the necessary reverse breakdown potential drop across a further rectifying junction between the emitter region and an electrode which is also connected to the base region to provide a current exit lead from the device.

What has been shown is a multiple junction semiconductor device exhibiting a negative resistance characteristic whose direction and slope is fully defined at all times, which contains at least two rectifying junctions having relatively high and low reverse breakdown potentials, respectively, with the low breakdown potential junction being formed between two adjacent highly doped regions of opposite conductivity type semiconductive material, one of which is further connected to a lightly doped region of like conductivity type material that is also adjacent to the other of said two adjacent regions.

What is claimed is:

1. A hook-type semi-conductor device comprising a plurality of alternate regions of opposite conductivity types of semiconductive material connected in series and defining a group of rectifying junctions therebetween, a rectifying junction in said group having a first reverse breakdown potential, electrode means including an electrode portion of one conductivity type of semiconductive material positioned contiguous to two adjacent regions of said device so as to form an ohmic junction with one of said two adjacent regions and a further rectifying junction with the other of said two adjacent regions which has an opposite conductivity from that of said portion, said further rectifying junction having a second reverse breakdown potential less than said first breakdown potential.

2. A hook-type semiconductor device having only two terminals and comprising a plurality of alternate regions of opposite conductivity types of semiconductive material connected in series and defining a group of rectifying junctions therebetween, electrode means comprised of one conductivity type semiconductive material having a relative high concentration of its majority carriers which is positioned contiguous to two adjacent regions of said device, one of which is an end region having an opposite conductivity from that of said electrode, so as to form an ohmic junction with the inner region of said two adjacent regions and a further rectifying junction with said end region, said inner region having a relatively low concentration of its majority carriers and said end region having a relatively high concentration of its majority carriers, with one of said terminals making an ohmic connection with the other end region and the other terminal making an ohmic contact with said electrode.

3. A hook-type semiconductor device according to claim 1 in which one of said first-mentioned two adjacent regions has a relatively low concentration of its majority carriers and the other of said first-mentioned two adjacent regions has a relatively high concentration of its majority carriers, said electrode portion also having a relatively high concentration of its majority carriers, said portion being of the same conductivity type as that of said one of said first-mentioned two adjacent regions.

4. A multiple junction semiconductor device containing a first rectifying junction having a relatively high reverse breakdown potential formed between a first pair of two adjacent regions of opposite conductivity-type semiconductor materials, a second rectifying junction having a relatively low reverse breakdown potential formed between a second pair of two adjacent regions of opposite conductivity-type semiconductor materials which contain relatively high concentrations of their respective carriers, one region of said second pair forming an electrode providing further contact with a region of like conductivity-type semiconductor material of said first pair, said like region having a relatively low concentration of its majority carriers and being adjacent to the other region of said second pair.

5. A hook-type semiconductor device comprising a plurality of alternate PNPN regions connected in series and defining rectifying junctions therebetween, said outer P and N-regions having a relatively high concentration of their respective majority carriers, and said inner P and N-regions having a relatively low concentration of their respective majority carriers, electrode means consisting of a P-type semiconductor material having a relatively high concentration of its majority carriers positioned continguous to said inner P and outer N-regions, and ohmic contact means attached to said electrode and to said outer P-region of said PNPN semiconductor device.

References Cited in the file of this patent

UNITED STATES PATENTS

| | | |
|---|---|---|
| 2,623,105 | Shockley et al. | Dec. 23, 1952 |
| 2,654,059 | Shockley | Sept. 29, 1953 |
| 2,717,343 | Hall | Sept. 6, 1955 |
| 2,895,058 | Pankove | July 14, 1959 |